United States Patent [19]

Kizaki

[11] 4,253,036
[45] Feb. 24, 1981

[54] SUBMINIATURE TUNING FORK QUARTZ CRYSTAL VIBRATOR WITH NICROME AND PALLADIUM ELECTRODE LAYERS

[75] Inventor: Shigeru Kizaki, Hanno, Japan

[73] Assignee: Citizen Watch Company Limited, Japan

[21] Appl. No.: 925,936

[22] Filed: Jul. 19, 1978

[30] Foreign Application Priority Data

Sep. 17, 1977 [JP] Japan .............................. 52/111986
Sep. 21, 1977 [JP] Japan .............................. 52/113677
Sep. 27, 1977 [JP] Japan .............................. 52/115769

[51] Int. Cl.³ .......................................... H01L 41/08
[52] U.S. Cl. .................................. 310/361; 310/364; 310/370
[58] Field of Search ............... 310/361, 366, 370, 364, 310/340

[56] References Cited

U.S. PATENT DOCUMENTS

| | | | |
|---|---|---|---|
| 2,266,768 | 12/1941 | Kornei | 310/340 X |
| 2,289,954 | 7/1942 | Arndt, Jr. | 310/340 X |
| 3,831,043 | 8/1974 | Hoffman et al. | 310/364 X |
| 3,940,638 | 2/1976 | Terayama | 310/364 X |
| 3,944,862 | 3/1976 | Shimoi et al. | 310/370 |
| 3,969,641 | 7/1976 | Oguchi et al. | 310/370 X |
| 4,099,078 | 7/1978 | Shibata et al. | 310/361 |

Primary Examiner—Mark O. Budd

[57] ABSTRACT

A subminiature flexural mode quartz crystal vibrator comprises a tuning fork formed by photolithographic techniques from a thin quartz crystal plate obtained by rotating an X-cut plate around the X-axis by an angle of 0° to 10° and further rotating the X-cut plate around the Y'-axis by an angle of 70° to 90°, the plate having a thickness of less than 0.2 mm. Electrodes formed on sides of the tines are of a different metallic material from planar electrodes formed on at least one of the top and bottom surfaces of the tines. A side electrode of one tine is electrically connected by an overlapping joint with a planar electrode of the other tine.

9 Claims, 16 Drawing Figures

SUBMINIATURE TUNING FORK QUARTZ CRYSTAL VIBRATOR WITH NICROME AND PALLADIUM ELECTRODE LAYERS

Field of the Invention

This invention relates to a subminiature tuning fork-type quartz crystal vibrator, and more particularly to a a subminiature tuning fork-type quartz crystal vibrator that can be econimically mass produced and has excellent operating characteristics.

BACKGROUND OF THE INVENTION

Recently, much progress has been made in the field of electronic wristwatches, particularly in the area of size and cost reduction, and in the number and types of timepiece functions which are available. Improvements can especially be seen in the design and manufacture of recently proposed quartz crystal vibrators, in which conventional mechanical processing techniques have given way to photolithographic techniques as are used to produce semi-conductors. However, although these new techniques are well suited to mass-production, vibrator characteristics as good as those obtained through the conventional mechanical processing techniques cannot be had. In contrast to the +5° X-cut tuning fork flexural mode vibrators having electrodes on their top, bottom and side surfaces, the vibrators manufactured by the new techniques are less than satisfactory due to their high crystal impedance, large $C_0/C_1$ ratio, and from the fact that vibrator frequency variation is small with respect to variations in trimmer condenser capacity. Fundamentally, the placement of an electrode on the sides of a tuning fork tine is required to obtain an efficient piezo-electric effect; however, good characteristics cannot be attained if it is decided that the photolithographic technique is suitable for the formation of top and bottom electrode only. In other words, it was conventionally believed that the application of photolithographic techniques was extremely difficult except for the formation of the top and bottom electrodes.

SUMMARY OF THE INVENTION

It is, therefore, an object of the present invention to provide a +5° X-cut thin, flexural mode quartz crystal vibrator which can overcomes the shortcomings encountered in prior art.

It is another object of the present invention to provide a tuning fork-type quartz crystal vibrator which has a low crystal impedance and a temperature-resonance characteristic that has a high flexion-point.

It is still another object of the present invention to provide a flexural mode quartz crystal vibrator which is inexpensive, small-sized and readily manufactured.

It is a further object of the present invention to provide a subminiature flexural mode quartz crystal vibrator which can be manufactured by a chemical photo-etching process on a mass production basis and has excellent operating characteristics.

In accordance with the invention a flexural mode quartz crystal vibrator comprises an X-cut quartz crystal plate formed by rotating an X-cut plate around the X-axis by an angle of 0° to 10° and further rotating the X-plate around the Y'-axis by an angle of 70° to 90°. The quartz crystal plate has a thickness of less than 0.2 mm formed by photolithography into a tuning fork having two tines each of which has top surfaces, bottom surfaces and sides. Planar electrodes are formed on at least one of the top and bottom surfaces of each of the tines and side electrodes are formed on the sides of the tines. Metallic material from which the side electrodes are formed is different from that of which the planar electrodes are formed. The planar electrode formed on at least one of the top and bottom surfaces of one of the tines is electrically connected to the side electrodes of the other time while the planar electrode formed on at least one of the top and bottom surfaces of the secured time is electrically connected to the side electrodes of the first-mentioned tine. The electrical connections between the electrodes preferably comprise joint portions in which the electrodes overlap and contact in a laminated configuration.

BRIEF DESCRIPTION OF DRAWINGS

These and other objects, features and advantages of the present invention will become more apparent from the following description when taken in conjunction with the accompanying drawings, in which.

DESCRIPTION OF PRIOR ART

Figure 1:
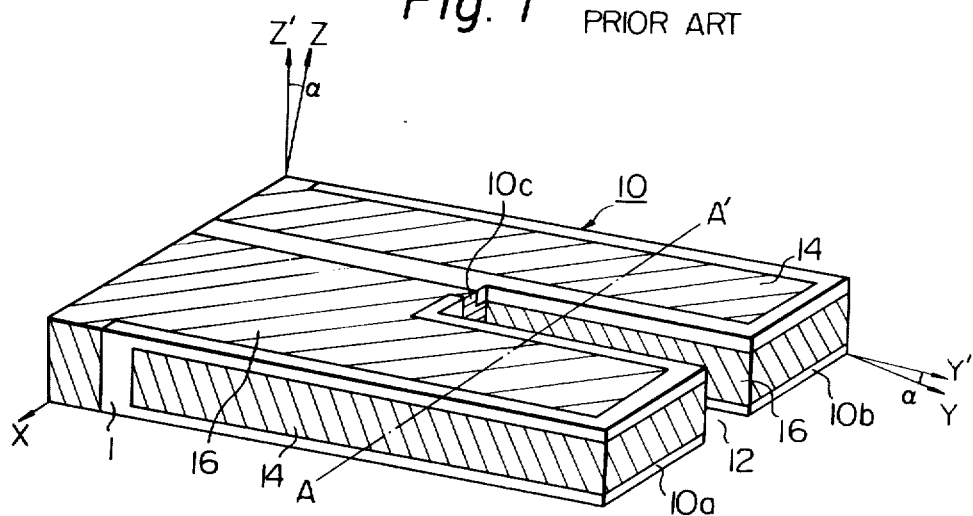
FIG. 1 is a perspective view of one example of a prior art tuning fork-type quartz crystal vibrator.
Figure 2:
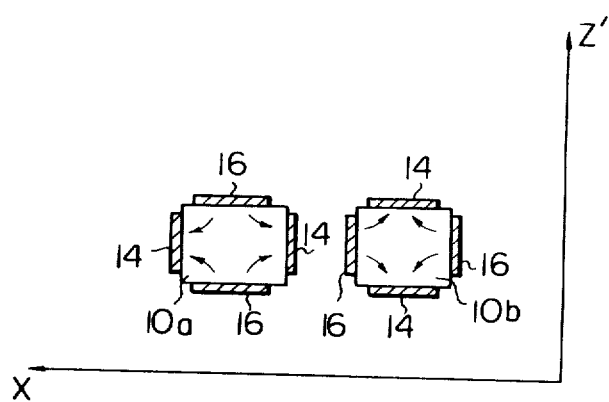
FIG. 2 is a cross sectional view of the tuning fork tines taken along lines A—A' of FIG. 1.

Referring now to FIGS. 1 and 2, there is shown a prior art +5° X-cut tuning fork flexural-mode quartz crystal vibrator 10 formed by a known mechanical process. The tuning fork vibrator 10 is illustrated with reference to the X, Y and Z axes, which represent the electrical, mechanical and optical axes of the quartz crystal plate, respectively. The quartz crystal vibrator 10 is formed from an X-cut quartz crystal plate which is obtained by rotating a Z-cut plate around the X axis by an angle α (0°–10°) and by cutting the plate along the Z' and Y' axes. The quartz crystal vibrator 10 has a slit 12 between a first tine 10a and a second tine 10b, the slit being formed by a wire-saw or a similar mechanical process. A first plurality of electrodes 14 are disposed on the sides of the first tine 10a, and a second plurality of electrodes 16 are disposed on the top and bottom surfaces of the second tine 10b. The electrodes 14 and 16 are deposited by a vacuum evaporation process or the like using a metallic mask. When an alternating voltage is applied to the electrodes 14 and 16, the electric fields are generated within the quartz crystal tines in a manner as shown by arrows in FIG. 2. The transverse components of the electric fields, i.e., the components in the direction of the electrical X-axis, effect a stress in the quartz crystal. In the electrode configuration of FIG. 2, the X-axis components of the electric fields have a different direction in each tine. Thus, a symmetrical flexural vibration is effected in the quartz crystal vibrator in the plane defined by the top and bottom surfaces when the alternating voltage is applied to the electrodes 14 and 16. Numerous difficulties, however, were experienced when trying to manufacture subminiature vibrators of this type while at the same time trying to maintain the efficiency of the piezo-electric effect. Namely, because the cutting of a quartz crystal vibrator into the shape of a tuning fork was accomplished by a mechanical processing method, reduction in the size thereof encountered difficulties as did the placement of a metallic mask for the formation of the electrodes.

Figure 3:
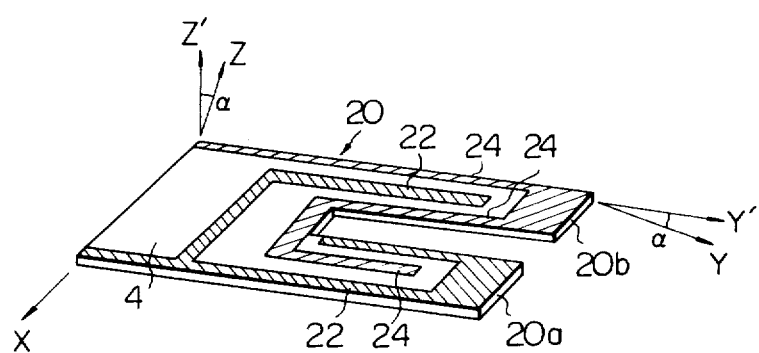
FIG. 3 is a perspective view of another example of a prior art tuning fork-type quartz crystal vibrator.
Figure 4:
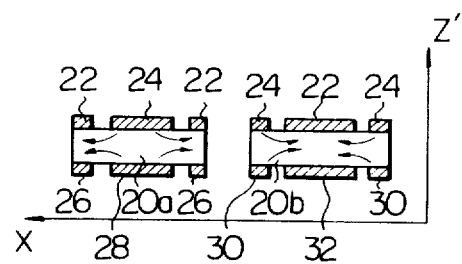
FIG. 4 is a cross sectional view of the tines of the vibrator shown in FIG. 3.

To solve these problems, U.S. Pat. No. 3,969,641 proposes to provide various types of tuning fork quartz crystal vibrators, one example of which is shown in FIG. 3. This vibrator is fabricated by the well-known conventional method, namely by rotating the quartz crystal plate around the X-axis by an angle α (0°–10°), and by cutting the plate along the Z' and Y' axes. According to this arrangement, the side electrodes were formed in their entirety on the top and bottom surfaces of the quartz crystal plate. Electrodes 22 and 24 are formed on the top surface of the vibrator plate, and electrodes 26, 28, 30 and 32 are formed on the bottom surface of the vibrator plate. By coupling electrode 22 to electrodes 26 and 32, and further coupling electrode 24 to electrodes 28 and 30, and then applying an alternating voltage thereto, a transverse electric field is generated in each of tines 20a and 20b. Thus, a symmetrical flexural vibration of the tuning fork vibrator is achieved. This arrangement allows the photo-etching process to be readily applied. Nevertheless, it is still not possible to attain characteristics comparable to that afforded by the top, back and side electrode arrangement, crystal impedance is a high 50 to 100 KΩ and is likely to vary sharply depending upon the degree of vacuum, which thus made sealing difficult, the $C_0/C_1$ value is large and only a narrow range of trimmability could be obtained. Moreover, the low power consumption requirements of timepieces is not effectively fulfilled.

DESCRIPTION OF PREFERRED EMBODIMENTS

Accordingly, the present invention proposes the provision of a readily manufactured, subminiature, thin flexural-mode vibrator with a low crystal impedance in which photolithography is used to fabricate a +5° X-cut tuning fork quartz crystal vibrator.

Figure 5:
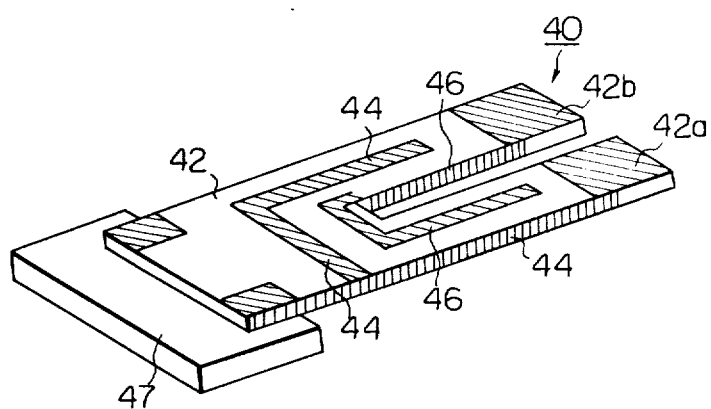
FIG. 5 is a perspective view of a preferred embodiment of a flexural tuning fork-type quartz crystal vibrator according to the present invention.
Figure 6:
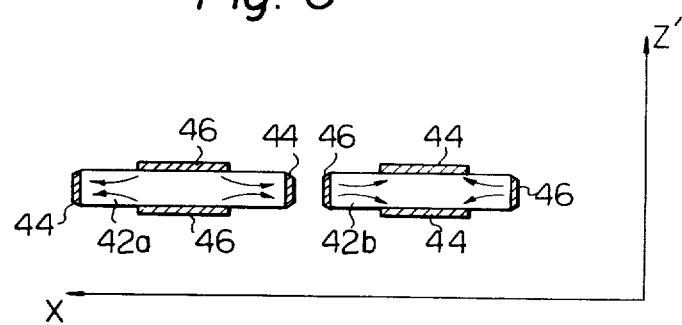
FIG. 6 is a cross sectional view of the tines of the vibrator shown in FIG. 5.

FIGS. 5 and 6 illustrates a preferred embodiment of a flexural mode quartz crystal vibrator according to the present invention. The quartz crystal vibrator 40 comprises an X-cut quartz crystal plate 42 which is formed by rotating the X-cut plate 42 around the X axis by 0° to 10° and further rotating the plate 42 around the Y' axis by 70° to 90° in the same manner as shown in FIG. 3. The plate 42 is 0.2 mm or less in thickness and is formed into a shape of a tuning fork in a manner as will be described in detail hereinafter. In accordance with the present invention, a first plurality of electrodes 46 are formed on the top and bottom surfaces of a first tine 42a of the plate and are also formed on the sides of a second tine 42b. Similarly, a second plurality of electrodes 44 are formed on the top and bottom surfaces of the second tine 42b and are formed on the sides of the first tine 42a. The electrodes 46 formed on the top and bottom surfaces of the first tine 42a are electrically interconnected with the electrodes 46 formed on the sides of the second tine 42b. Likewise, the electrodes 44 on the sides of the first tine 42a are electrically interconnected with the electrodes 44 on the top and bottom surfaces of the second tine 42b. The vibrator 40 is mounted at its foot portion on a support or substrate 47 made of ceramic or other suitable material. A suitable electrode pattern may be formed on the support 47 and electrically connected to the electrodes 44 and 46 to apply an alternating voltage thereto. With this configuration, when the alternating voltage is applied to the electrodes, transverse electric fields are generated within the quartz crystal plate 42, the major component of the electric fields being substantially parallel to the planar surfaces of the plate 42 and defining a vibrational direction in parallel with the planar surfaces. The quartz crystal vibrator mentioned above has an advantage that its crystal impedance is low and the flexion-point temperature of its temperature-resonance frequency characteristic is high. In addition, a photo-etching process can be readily utilized.

Figure 7:
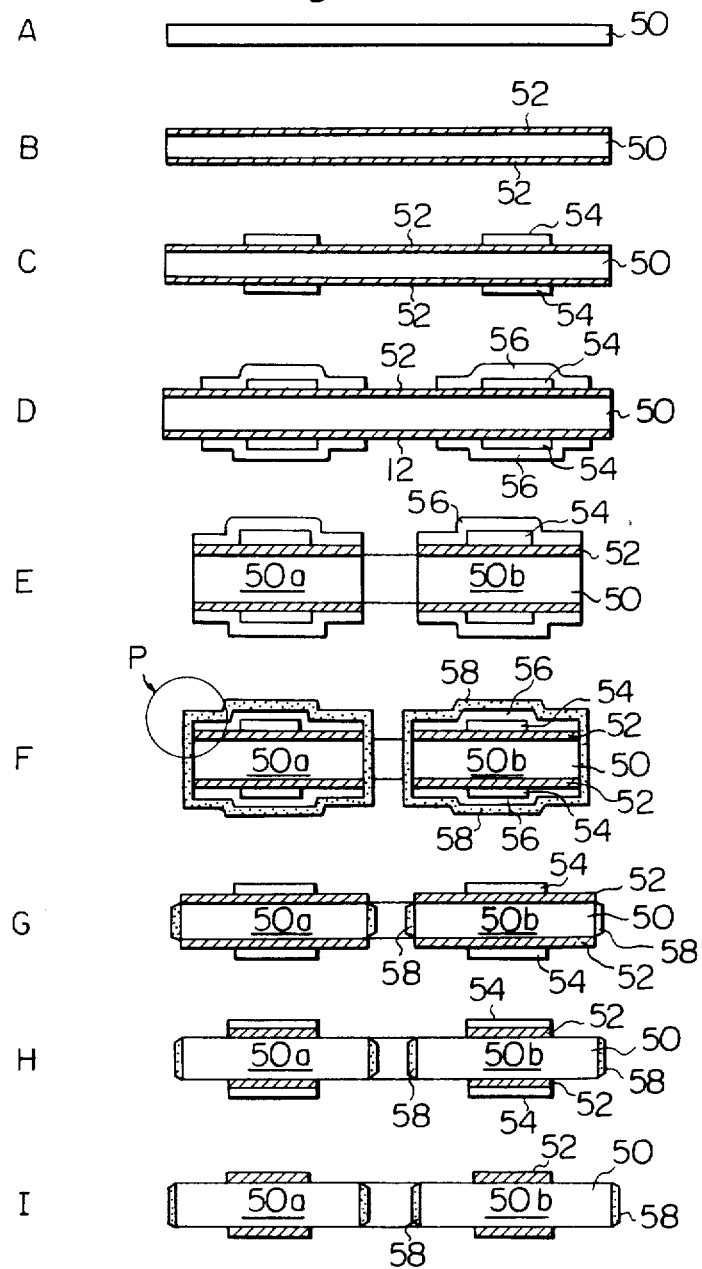
FIG. 7 is a series of cross-sectional views of the tines of a tuning fork-type quartz crystal vibrator and is useful in describing the manufacturing steps of the same according to the present invention.

A method of manufacturing a flexural mode, tuning fork-type quartz crystal vibrator according to the present invention will now be described in detail with reference to FIG. 7 in which various steps of the present method is exemplified, with the both tines of the tuning fork shown in cross section.

Step A

Both surfaces of a +5° X-cut quartz crystal plate 50 are ground to reduce plate thickness to from 50 to 200 microns.

Step B

Both surfaces of the plate 50 are coated by a vacuum evaporation or spattering process with a metallic thin film 52 composed of a chrome layer deposited on the plate and a gold layer deposited on the chrome layer. The film will serve as the top and bottom electrodes as well as mask which is resistant to hydrofluoric acid used to etch the plate into the shape of a tuning fork.

Step C

A negative-type photo resist (such as a mixture of cyclized rubber and bisazide, sold under KMR-747, 752 by Kodak) is applied to both surfaces of the plate 50, which surfaces are then exposed to light through a photo mask by a biprojection aligner so that a planar electrode pattern 54 is formed on the film 52.

Step D

A positive photo resist which is a mixture of naphthoquinon diazide and novolak resin (such photo resists as sold under the following brand names may be used: Az-1350, manufactured by shitley Co., Ltd., USA, or OFPR series, manufctured by Tokyo Ohka Kogyo Co., Ltd., Japan, etc) is applied to both surfaces of the plate, which surfaces are then exposed to light through a photo mask by the biprojection aligner so that a tuning fork pattern 56 is formed on the plate 50 over the negative photo resist 54.

Step E

The plate 50 is steeped in etchant for gold and then steeped in etchant for chrome. Thereafter, the plate 50 is steeped in etchant for the plate so that the plate 50 is etched away to form a tuning fork shape having tines 50a and 50b. The photo resist 56 serves as an etching mask to leave the film 52 on the plate 50.

Step F

In order to form the side electrodes, a thin metallic film 58 composed of a nichrom layer and a palladium layer is deposited by vacuum evaporation and covers the top and bottom as well as the sides of the tines 50a, 50b. In this case, the positive photo resist 56 acts as a protective film so that the metallic layer 52 does not become joined to the metallic layer 58. The metallic layer 58 is selected to have a thickness less than 3000 Å, i.e., a thickness of 1000 to 2000 Å for a reason to be subsequently described.

Step G

Figure 8:
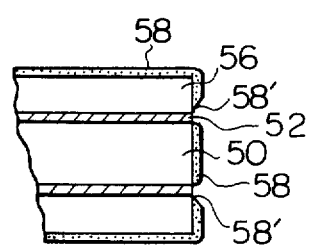
FIG. 8 is an enlarged cross-sectional view of a portion P in Step F of FIG. 7.

The plate 50 is steeped in a stripping agent so that the thin metallic film 58 depositied on the top and bottom as well as the sides of the plate in step F and the photo resist 56 lying therebelow are removed. This will now be described with reference to FIG. 8 which shows an enlarged view of the portion P in FIG. 7. Since the positive photo resist 56 is exposed to light by the projection aligner, exposure must continute for an extremely long period (15 to 20 seconds) to effect photolytic degradation since the spectrum of an ultraviolet lamp comprises only g rays due to its lens system which is one defect of the biprojection aligner. As a result of this lengthy exposure, halation develop so that the side edge of the photo resist 56 is slanted as at 58' along the boundary of the thin metallic film 52. Therefore, the thin metalic film 58 will not be deposited on the slanted area 58', and the stripping agent will readily penetrate into between the photo resist 56 and the metallic film 52. Furthermore, since the metallic film 58 is deposited to a thickness of 1000 to 2000 Å, in step F, pin holes will tend to form within the same and the stripping agent will penetrate these pin holes to the surface of the photo resist 56. The above two factors allow the photo resist 56 and thin metalic film 58 to be completely stripped off.

Step H

The negative-type photo resist 54, which remains after having stripped off the positive-type photo resist 56 in step G, serves as a mask for the thin metallic layer 52 which is now steeped in an etchant and etched away. Upon doing so, the thin metallic film 58 which will serve as the side electrodes is not attacked by the etchant.

Step I

The plate 50 is then steeped in the stripping agent, and the negative-type photo resist 54 is stripped off so that the vibrator shown in FIG. 5 is obtained.

The process outlined above also makes it possible to form solely the side electrodes 58 on the thinly ground quartz crystal plate 50.

Accordingly, the process of the present invention is characterized in that the negative and positive-type photo resists are formed in combination, the positive photo resist being put to use as a film for protecting the top and bottom electrodes so that there is no adhesion to the top and bottom surfaces when the side electrodes are formed.

Figure 9:
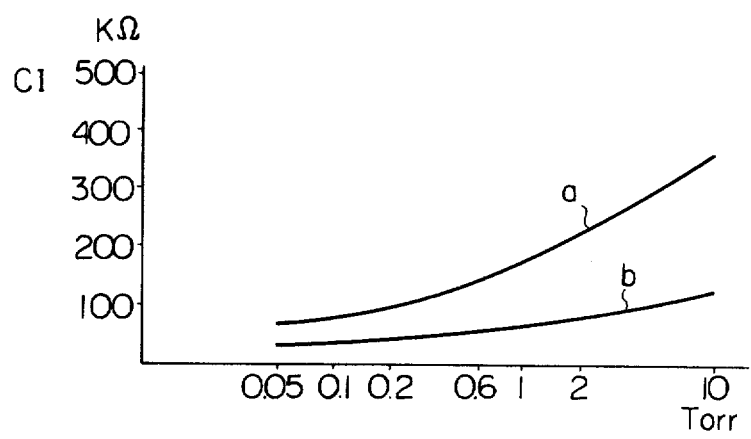
FIG. 9 is a graph showing the relation between degree of vacuum and crystal impedance, especially in so far as the effect of the present invention is concerned.

The +5° X-cut tuning fork flexural mode vibrator having side electrodes as well as top and bottom electrodes as fabricated according to the present invention exhibits a crystal impedance which is a low 20 to 30 KΩ, a $C_1$ value of $1.5 \times 10^{-3}$ PF which is one unit larger than that available in the prior art, and a variation in crystal impedance with respect to degree of vacuum as illustrated by the curve b in FIG. 9, curve a representing the characteristic of the prior art. It can be understood from the curves that there is less variation over the given range.

The present invention allows tuning fork-type quartz crystal vibrators to be readily subminiaturized and mass produced thanks to the application of a chemical photoetching process, reduces the deterioration in characteristics which accompany sub-miniaturization, and is helpful in reducing power consumption. Accordingly, the invention is particularly effective when applied to +5° X-cut flexural mode tuning fork vibrators. However, the invention is not limited to vibrators of the tuning fork-type; it may also be applied to bar-type members and for forming side electrodes on other piezo-electric materials.

Figure 10:
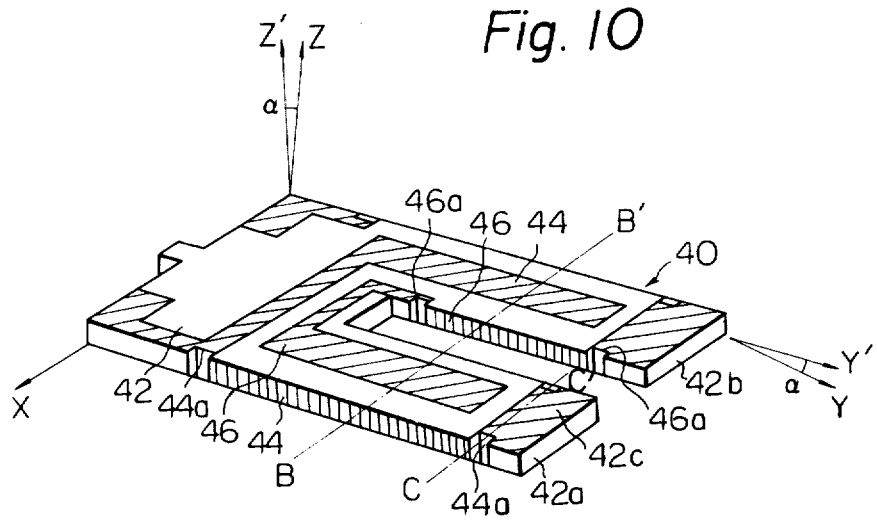
FIG. 10 is a perspctive view of another preferred embodiment of a +5° X-cut tuning fork quartz crystal vibrator according to the invention.
Figure 11:
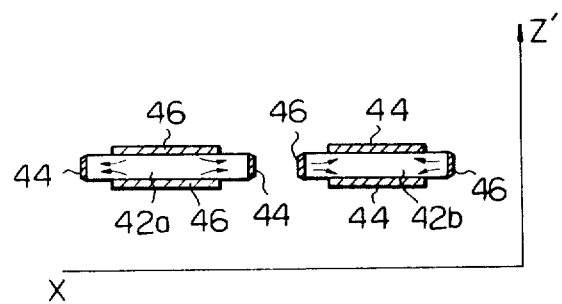
FIG. 11 is a cross-sectional view taken along the line B—B' of FIG. 10.

FIGS. 10 and 11 illustrate another preferred embodiment of flexural-mode tuning fork quartz crystal vibrator according to the present invention, with like or corresponding component parts bearing the same reference numerals as those used in FIG. 5. The illustrated embodiment of FIG. 10 is identical to that of FIG. 5 except that the side electrodes 44 and 46 have joint portions 44a and 46a which partially extend to the top and bottom surfaces of the plate 42 to enhance a reliable electrical connection.

Figure 12:
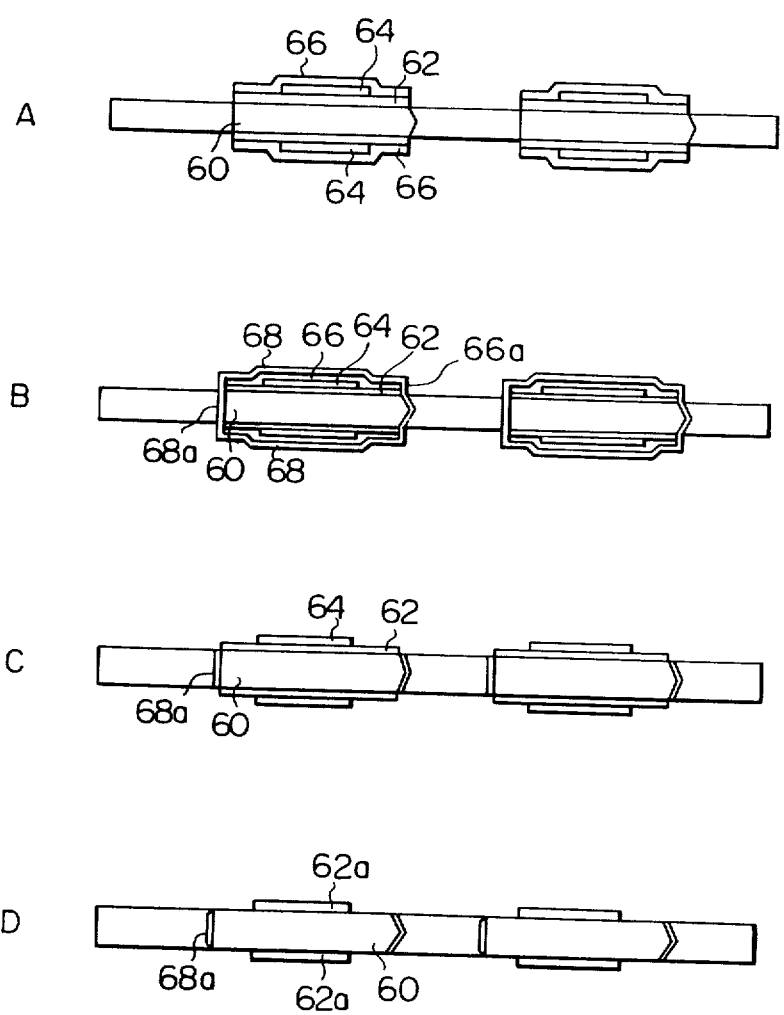
FIG. 12 shows various steps of a manufacturing process for the vibrator shown in FIG. 10.

The tuning fork quartz crystal vibrator of FIG. 10 is manufactured by a process which will be described below with reference to FIG. 12 which shows various steps of the manufacturing process.

Step A

Both the top and bottom surfaces of a quartz crystal plate 60 are provied with a metallic film 62 composed of a chrome layer and a gold layer in the shape of a tuning fork. The film 62 acts as a mask when the tuning fork is etched by hydrofluoric acid. A negative-type photo resist 64 is applied to both surfaces of the plate to form top and bottom electrode patterns on the plate 60. A positive-type photo resist 66 in the shape of a tuning fork is then deposited on the photo resist 64. The photo resist 66 will serve as a protective film when the side electrodees are formed. Masks are thus defined by the thin metallic film 62 of chrome and gold layers as well as the negative and positive photo resists 64, 66 which are resistant to the hydrofluoric acid.

Step B

A side electrode 68a is formed only at the required portion, using a metallic mask and a vacuum evaporation process to deposit nichrome and palladium layers. The reason for depositing a material which is different from the thin metallic film 62 disposed on the top and bottom surfaces will be explained in step C. The nichrome and palladium layers 68 which adhers to the photo resist 66 at the time that the side electrodes 68a are formed is eventually to be removed. Removal of the photo resist 66 is made possible because acetone or the like can permeate through pin holes in the top and bottom metallic film 68 and through the cross-sectional portion 66a of the positive photo resist 66. For example, if the nichrome and palladium layers 68 were applied to a thickness in excess of 3000 Å, few pin holes would develop and removal would thus be impossible.

Step C

The positive-type photo resist 66 is removed, followed by the etching away of the thin metallic layer 62 which is partially masked by the negative photo resist 64. It can now be understood that the side electrodes 68a, if they too were made of chrome and gold layers, would also be etched away in this step since they are not masked. Thus, by adopting the nichrome and palladium layers as the material for the side electrodes 68a, neither will be attacked by etchants for the chrome and gold.

Step D

The negative photo resist 64 is removed, leaving the top and bottom electrodes 62a.

In the prior art vibrator shown in FIG. 1, the side electrode is connected to the top electrode at the bottom 10c of the tuning fork stem. However, this bottom portion in a tuning fork obtained by photo etching becomes irregularly shaped so that it is difficult to form the electrode films at this position. Moreover, difficulties are encountered along the side edges when both side electrodes in FIG. 10 are cut. Hence, the connection to the top and bottom electrodes is accomplished by way of a joint portion 46a provided in the tine and spaced some distance away from the bottom portion of the tuning fork stem.

Figure 13:
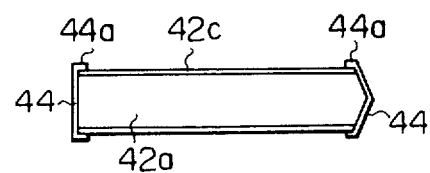
FIG. 13 is a cross-sectional view taken along the line C—C' of FIG. 10.

FIG. 13 which is a cross-sectional view of the tuning fork illustrated in FIG. 10 taken along the lines C—C' shows a method of connecting the portions of the side electrodes 44 disposed on the inward and outward sides of the tines. Namely, the side electrode 44 on the inward side of the tine is laminated on a portion of a top lead film 42c can be formed during Step A by neglecting to form the photo resist 66 on said portions 46a, 44a.

Figure 14:
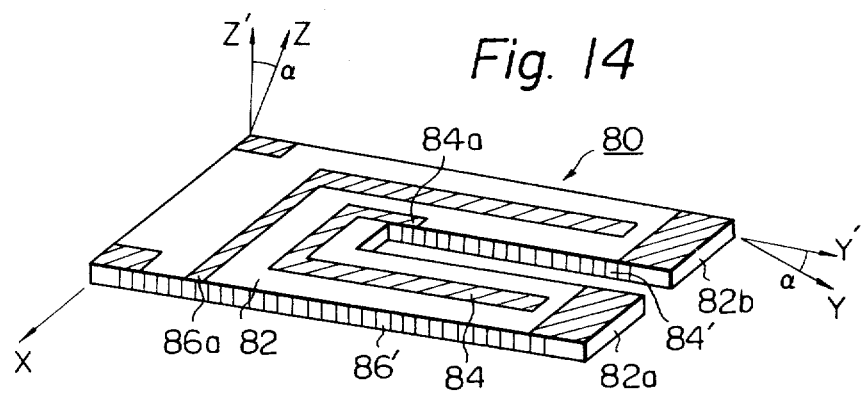
FIG. 14 is a perspective view of another preferred embodiment of a tuning fork-type quartz crystal vibrator according to the present invention.
Figure 15:
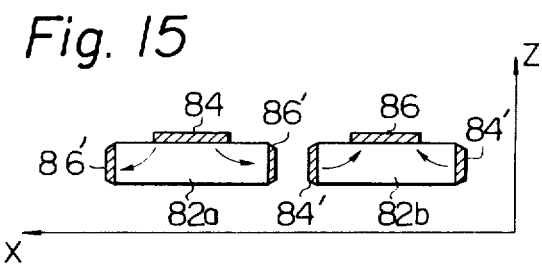
FIG. 15 is a cross-sectional view of the tines of the tuning fork vibrator shown in FIG. 14.

FIG. 14 shows another preferred embodiment of a tuning fork-type quartz crystal vibrator according to the present invention. In this illustrated embodiment, the vibrator 80 comprises a +5° X-cut quartz crystal plate 82 which is obtained by rotating the plate 82 around the X-axis by an angle (0°-10°) the cut being made along the Z' and Y' axes. The quartz crystal plate 82 thus formed has first and second tines 82a and 82b. A planar electrode 84 is formed only on the top surface of the first tine 82a on the side surfaces of which side electrodes 86' are formed. A planar electrode 86 is formed only on the top surface of the second tine 82b on the side surfaces of which side electrodes 84' are formed. The planar electrode 84 of the first tine 82a and the side electrodes 84' are interconnected with each other by a joint portion 84a, and the planar electrode 86 of the second tine 82b is interconnected with the side electrodes of the first tine 82a by a joint portion 86a. When an alternating voltage is applied to these electrodes, a substantially transverse electric field is generated in each time, and symmetrical flexural vibration of the tuning fork vibrator is achieved as shown in FIG. 15.

Figure 16:
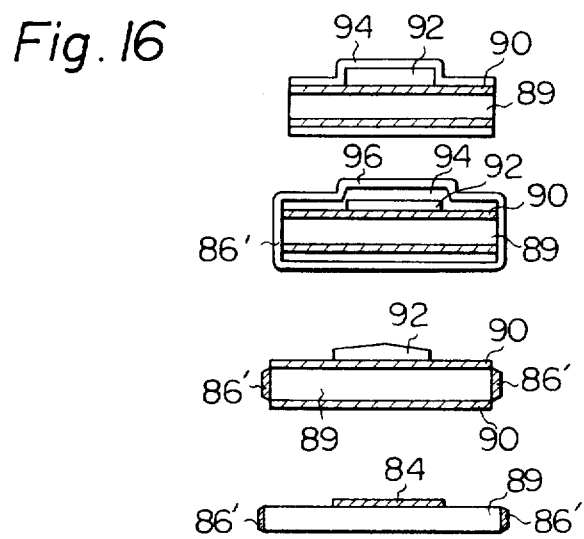
FIG. 16 is a cross-sectional view of one tuning fork tine and is useful in describing the manufacturing process for the vibrator shown in FIG. 14 according to the present invention.

Referring to FIG. 16 for a description of a manufacturing process for the vibrator shown in FIG. 14 a thin metallic film 90 composed of chrome and gold layers is formed in the shape of a tuning fork on a quartz crystal plate 89, an electrode pattern is formed on the metallic film 90 by means of a negative-type photo resist 92, and a positive-type photo resist 94 is formed in the shape of a tuning fork on the negative photo resist 92 and metallic film 90. Next, the quartz crystal plate 89 is processed into the shape of a tuning fork by means of hydrofluoric acid, and the side electrodes 96, which comprises nichrome and palladium layers, that is different in material from the metallic film 90, are deposited by vacuum evaporation. Thereafter the thin metallic film 96 of the top and bottom surfaces is removed; however, using NN-dimethylformamide which permeates through pinholes in the metallic film 96, the underlying positive photo resist 94 dissolves and is thus removed at the same time as the metallic film on the top and bottom surfaces. Then, with the negative photo resist 92 acting as a mask, the metallic film 90 on the top and bottom surfaces is etched away. Since the metallic film 90 and the metallic film 96 on the sides of the substrate are composed of different materials, the metallic film 96 is not attacked by the etchant. Finally, removing the negative photo resist 92 on the top surface allows the finished product, namely a quartz crystal plate 89 with a top electrode 84 and side electrodes 86', to be obtained. This process thus does not require expensive exposure equipment since the negative photo resist 92 is applied on only one top surface so that a single-side exposure device will suffice.

By combining the above-mentioned process with the vibrator of the present invention it is possible to apply a photolithographic technique to the manufacture of a +5° X-cut subminiature flexural mode vibrator having a top or bottom electrode and side electrodes, whereby manufacture is greatly facilitated while great improvements can be attained in electrical characteristics in comparison to that obtainable with a vibrator having only top and bottom electrodes. The vibrator of the invention is inexpensive, extremely small and features a low crystal impedance.

What is claimed is:

1. A flexural mode quartz crystal vibrator comprising:
   an X-cut quartz crystal plate formed by rotating an X-cut plate around the X-axis by an angle of 0° to 10° and further rotating the X-cut plate around the Y'-axis by an angle of 70° to 90°, said quartz crystal plate having a thickness of less than 0.2 mm as formed by a photolithographic technique into a tuning fork having first and second tines each having top and bottom surfaces as well as sides;

planar electrodes formed on at least one of the top and bottom surface of said first and second tines, respectively, each of said planar electrodes comprising a chrome layer and a gold layer deposited on said chrome layer; and side electrodes formed on the sides of said first and second tines, respectively, each of said side electrodes comprising a nichrome layer and a palladium layer deposited on the nichrome layer;

the planar electrode formed on at least one of the top and bottom surfaces of said first tine being electrically connected to the side electrodes of said second tine, while the planar electrode formed on said at least one of the top and bottom surface of said second tine is electrically connected to the side electrodes of said first tine.

2. A flexural mode quartz crystal vibrator according to claim 1, in which said side electrodes have joint portions laminated on said planar electrodes.

3. A flexural mode quartz crystal vibrator according to claim 1, in which said side electrode has a thickness which is in the range of 1000 to 2000Å.

4. A flexural mode quartz crystal vibrator comprising:

an X-cut quartz crystal plate formed by rotating an X-cut plate around the X-axis by an angle 0° to 10° and further rotating the X-cut plate around the Y'-axis by an angle of 70° to 90°, said quartz crystal plate having a thickness of less than 0.2 mm as formed by a photolithographic technique into a tuning fork having first and second tines each having top and bottom surfaces as well as sides;

planar electrodes formed on at least one of the top and bottom surfaces of said first and second tines, respectively, each of said planar electrodes comprising a chrome layer and a gold layer deposited on said chrome layer; and side electrodes formed on the sides of said first and second tines, respectively, each of said side electrodes comprising a nichrome layer and a palladium layer deposited on the nichrome layer;

the side electrode of said second tine having a first joint portion which contacts the planar electrode formed on said at least one of the top and bottom surfaces of said first tine, whereby said side electrode and planar electrode are electrically connected, and the side electrode of said first tine having a second joint portion which contacts the planar electrode formed on said at least one of the top and bottom surfaces of said second tine, whereby said side electrode of the first tine and planar electrode of the second tine are electrically connected.

5. A flexural mode quartz crystal vibrator according to claim 4, in which each of said side electrodes has a thickness of 1000 to 2000Å.

6. A flexural mode quartz crystal vibrator comprising:

an X-cut quartz crystal plate formed by rotating an X-cut plate by an angle of 0° to 10° and further rotating the X-cut plate around the Y'-axis by an angle of 70° to 90°, said quartz crystal plate having a thickness of less than 0.2 mm as formed by a photolithographic technique into a tuning fork having first and second tines each having top and bottom surfaces as well as sides;

planar electrodes formed on at least one of the top and bottom surfaces of said first and second tines, respectively, each of said planar electrodes comprising a chrome layer and a gold layer deposited on said chrome layer; and side electrodes formed on the sides of said first and second tines, respectively, each of said side electrodes comprising a nichrome layer and a palladium layer deposited on the nichrome layer;

the side electrode of said second tine having a first joint portion which overlaps and contacts in a laminated configuration the planar electrode formed on said at least one of the top and bottom surfaces of said first tine, whereby said side electrode of the second tine and said planar electrode of the first tine are electrically connected, and the side electrode of said first tine having a second joint portion which overlaps and contacts in a laminated configuration the planar electrode formed on said at least one of the top and bottom surfaces of said second tine, whereby said side electrode of the first tine and said planar electrode of the second tine are electrically connected.

7. A flexural mode quartz crystal vibrator according to claim 6, in which each of said side electrodes has a thickness which is in the range of 1000 to 2000Å.

8. A flexural mode quartz crystal vibrator comprising:

an X=cut quartz crystal plate formed by rotating an X-cut plate around the X-axis by an angle of 0° to 10° and further rotating the plate around the Y'-axis by an angle of 70° to 90°, said quartz crystal plate having a thickness of less than 0.2 mm as formed by a photolithographic technique into a tuning fork having first and second tines each having top and bottom surfaces as well as sides;

planar electrodes formed on at least one of the top and bottom surfaces of said first and second tines, respectively, each of said planar electrodes comprising a chrome layer and a gold layer deposited on the chrome layer; and side electrodes formed on the sides of said first and second tines, respectively, each of said side electrodes comprising a nichrome layer and a palladium layer deposited on the nichrome layer;

the side electrode of said second tine having a joint portion which overlaps and contacts in a laminated configuration the planar electrode forming on said at least one of the top and bottom surfaces of said first tine, whereby said side electrode of the second tine and said planar electrode of the first tine are electrically connected, and said the side electrode of said first tine having a second joint which overlaps and contacts in a laminated configuration the planar electrode formed on said at least one of the top and bottom surfaces of said second tine, whereby said side electrode of the first tine and said planar electrode of the second tine are electrically connected.

9. A flexural mode quartz crystal vibrator according to claim 8, in which each of said side electrodes has a thickness which is in the range of 1000 to 2000Å.

* * * * *